(12) United States Patent
Son et al.

(10) Patent No.: US 7,687,903 B2
(45) Date of Patent: Mar. 30, 2010

(54) POWER MODULE AND METHOD OF FABRICATING THE SAME

(75) Inventors: Joon-seo Son, Seoul (KR); Seung-won Lim, Bucheon-si (KR); O-seob Jeon, Seoul (KR)

(73) Assignee: Fairchild Korea Semiconductor Ltd., Bucheon-si, Gyeonggi-do (KR)

( * ) Notice: Subject to any disclaimer, the term of this patent is extended or adjusted under 35 U.S.C. 154(b) by 0 days.

(21) Appl. No.: 12/220,638

(22) Filed: Jul. 24, 2008

(65) Prior Publication Data

US 2009/0129028 A1    May 21, 2009

(30) Foreign Application Priority Data

Nov. 16, 2007   (KR) .................. 10-2007-0117360

(51) Int. Cl.
 *H01L 23/34* (2006.01)
(52) U.S. Cl. .............................. 257/723; 257/E23.169
(58) Field of Classification Search ................. 257/686, 257/723, E23.169; 438/123; 361/715
See application file for complete search history.

(56) References Cited

U.S. PATENT DOCUMENTS

| | | | |
|---|---|---|---|
| 5,313,095 A * | 5/1994 | Tagawa et al. | ............... 257/672 |
| 5,438,021 A * | 8/1995 | Tagawa et al. | ............... 438/107 |
| 5,703,399 A | 12/1997 | Majumdar | |
| 6,574,107 B2 * | 6/2003 | Jeon et al. | ................... 361/709 |

* cited by examiner

*Primary Examiner*—Roy K Potter
(74) *Attorney, Agent, or Firm*—Townsend and Townsend and Crew LLP (57) ABSTRACT

Provided are a power module including a power package and a control package that are provided separately and can be highly integrated, and method of fabricating the power module. The power module includes: a molded power package including at least one power device on a first lead frame; and a molded control package vertically stacked on the power package, and including at least one control device on a second lead frame. A first part of the first lead frame and a first part of the second lead frame are coupled to each other so that the power package and the control package can be electrically coupled to each other.

21 Claims, 6 Drawing Sheets

POWER MODULE AND METHOD OF FABRICATING THE SAME

CROSS-REFERENCES TO RELATED APPLICATIONS

This application claims the benefit of Korean Patent Application No. 10-2007-0117360, filed on Nov. 16, 2007, in the Korean Intellectual Property Office, the disclosure of which is incorporated herein in its entirety by reference.

BACKGROUND OF THE INVENTION

1. Field of Invention

The present invention relates to a semiconductor device, and more particularly, to a power module including a power device and a control device and a method of fabricating the power module.

2. Description of the Related Art

As electronic technology for power devices has developed, demands for power devices that can be formed to have a light weight and a small size with superior performances are increasing. Accordingly, demands for power modules that can integrate various power devices in one package and include control devices for controlling the power devices are also increasing.

For example, U.S. Pat. No. 5,703,399 assigned to Mitsubishi, Corp. discloses a power module. In this power module, a power device and a control device are mounted on a lead frame and molded as a package. However, this conventional power module has the following disadvantages.

It is difficult to provide various power modules promptly according to the needs of customers. This is because control circuits vary according to the types of products including the control circuits, and thus the power modules vary according to the products. Therefore, in order to meet the demands of customers, different power modules should be provided according to the demands of customers; however, it is difficult to provide different power modules because of a problem of the productivity.

In addition, conventional power modules are uneconomic, because the control device is added to the power device, which costs a lot, to form a package. Thus, the fabrication costs of the power module increase, and it is difficult to adopt a complicated control device in the power module.

In addition, it is difficult for a conventional power module to have a high degree of integration. Since the power device and the control device are disposed on the same horizontal plane in one package, it is difficult to reduce a size of the package.

Embodiments of the invention address these and other problems, individually and collectively.

BRIEF SUMMARY OF THE INVENTION

Embodiments of the present invention provide a power module including a power package and a control package provided separately and that can be highly integrated.

Embodiments of the present invention also provide a method of fabricating a power module, including combining a power package and a control package that are provided separately, such that the power module can be highly integrated.

According to an aspect of an embodiment of the present invention, there is provided a power module including a molded power package comprising at least one power device on a first lead frame and a molded control package vertically stacked on the power package, and comprising at least one control device on a second lead frame. A first part of the first lead frame and a first part of the second lead frame are coupled to each other so that the power package and the control package can be electrically coupled to each other.

According to an embodiment of the power module of the present invention, the power package may further include one or more first wiring pads on the first part of the first lead frame, and the control package may further include one or more second wiring pads on the first part of the second lead frame.

According to another embodiment of the power module of the present invention, the power package may further include a first molding member covering the power device such that the first part of the first lead frame is exposed out of the first molding member. Moreover, the power package may further include a heat dissipation substrate that is disposed on a surface of the power device opposite to that disposed on the first lead frame such that a part of the heat dissipation substrate is exposed out of the first molding member.

According to another embodiment of the power module of the present invention, the control package may further include a second molding member covering the control device such that the first part of the second lead frame is exposed out of the second molding member.

According to another embodiment of the power module of the present invention, the power package may further include one or more conductive bumps between the power device and the first lead frame.

According to another aspect of the present invention, there is provided a power module including a first lead frame having a first surface and a second surface, at least one power device disposed on the first surface of the first lead frame, a first molding member covering the at least one power device, and exposing a first part of the second surface of the first lead frame, a second lead frame having a third surface and a fourth surface, wherein a first part of the fourth surface is bonded with the exposed first part of the second surface of the first lead frame, at least one control device disposed on the third surface of the second lead frame, and a second molding member covering the at least one control device, and exposing the first part of the fourth surface of the second lead frame.

According to an embodiment of the power module of the present invention, an end portion of the first lead frame and an end portion of the second lead frame may be bent in a direction opposite to that in which the heat dissipation substrate is disposed with respect to the first lead frame.

According to another aspect of the present invention, there is provided a method of fabricating a power module, the method including forming a molded power package comprising at least one power device on a first lead frame, forming a molded control package comprising at least one control device on a second lead frame, and bonding a first part of the first lead frame with a first part of the second lead frame so that the power package and the control package can be electrically coupled to each other.

According to an embodiment of the method of manufacturing a power module of present invention, the bonding of the first part of the first lead frame with the first part of the second lead frame may be performed using a soldering process.

According to another embodiment of the method of manufacturing a power module of present invention, the method may further include trimming and bending end portions of the first lead frame and the second lead frame after performing the bonding process.

According to the power module of the present invention, the power package and the control package can be provided separately, and thus, the power module can be variously applied in a lot of power products according to needs of customers.

In addition, according to the power module of the present invention, the power package and the control package can be stacked in a perpendicular direction, it is advantageous for being highly integrated, and thus, the power module is suitable for power products having a small size and a light weight. Also, since the power package and the control package can be separated and provided in a small size, reliabilities of the packages can be improved, and thereby, improving reliability of the power module.

According to a method of fabricating the power module of the present invention, the control package can be separated to simplify processes of fabricating the power package that is expensive, and thus, fabrication costs of the power module can be reduced. In addition, a thickness of a second lead frame can be formed to be thinner than that of a first lead frame to reduce the fabrication costs of the power module.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

Figure 1:
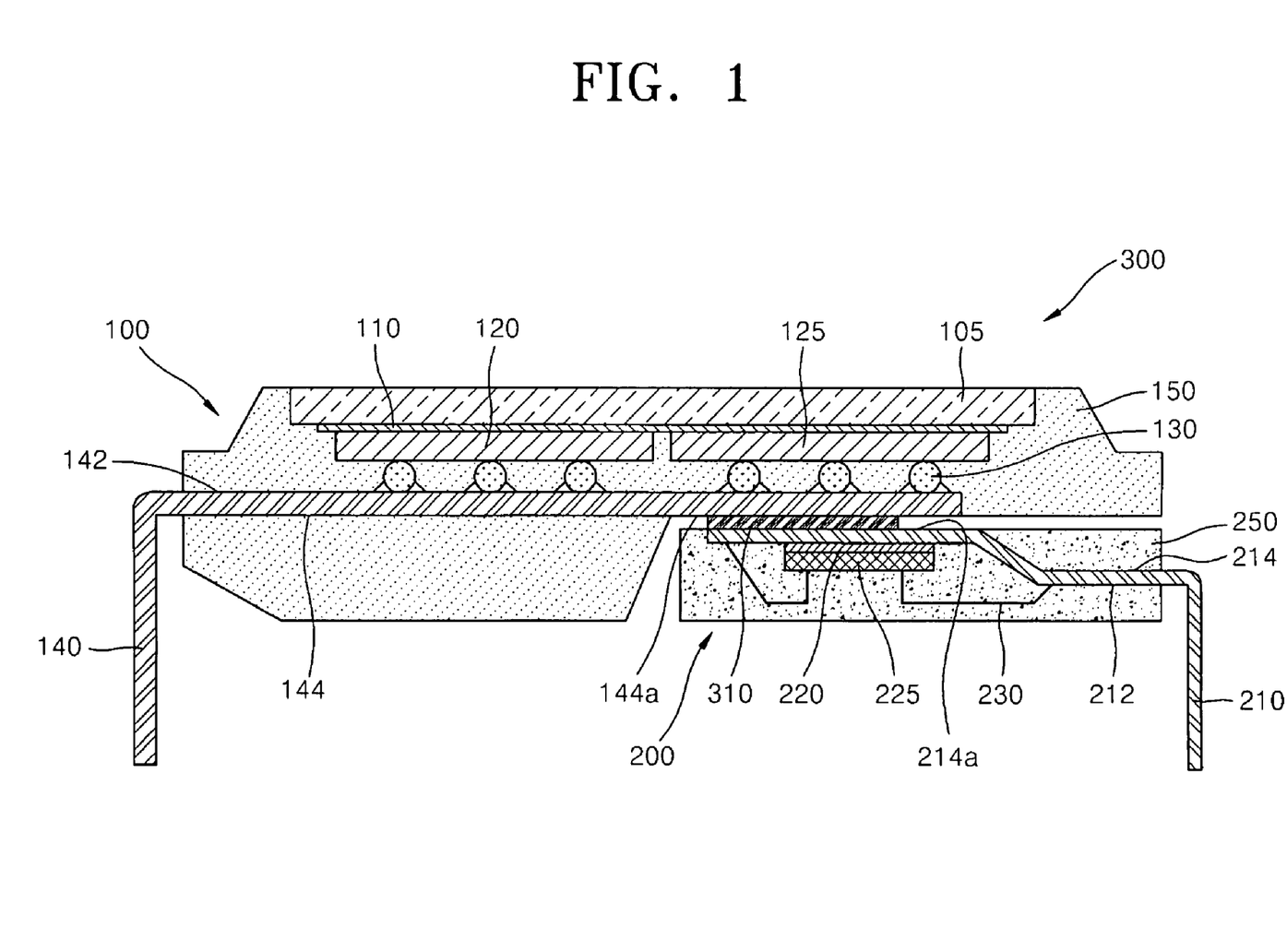
FIG. 1 is a cross-sectional view of a power module according to an embodiment of the present invention.
Figure 2:
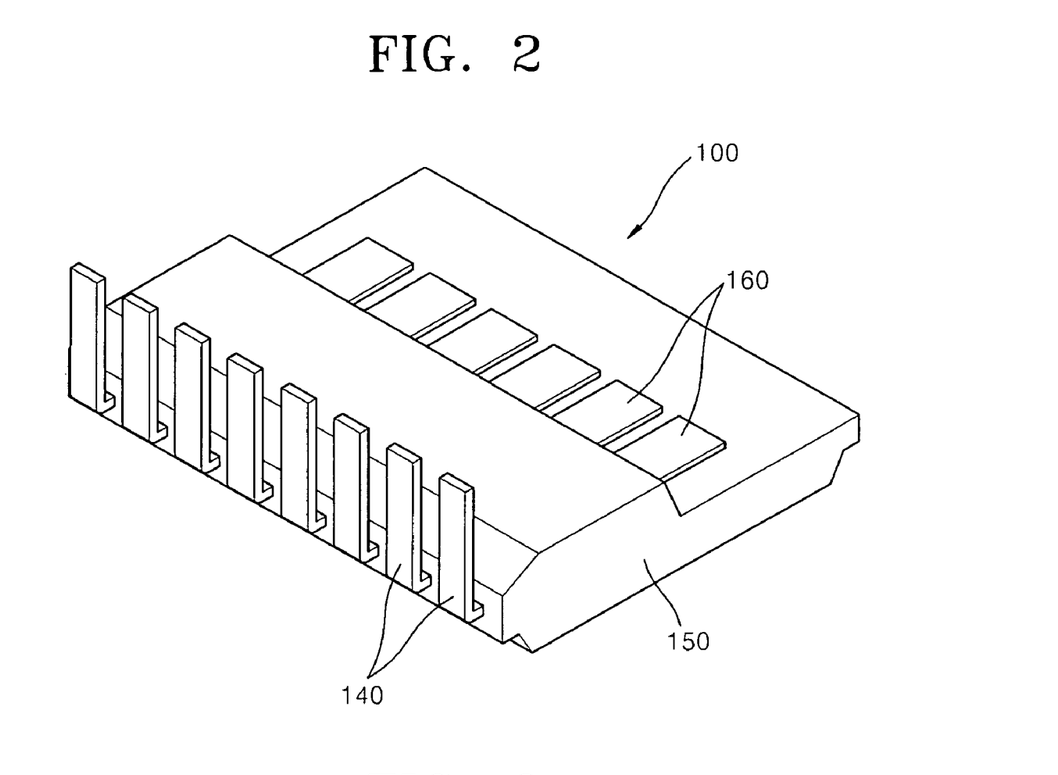
FIG. 2 is a perspective view of a power package in the power module of FIG. 1.

FIG. 1 is a cross-sectional view of a power module 300 including a power package 100 and a control package 200, according to an embodiment of the present invention. FIG. 2 is a perspective view of the power package 100 according to an embodiment of the present invention, and FIG. 3 is a perspective view of the control package 200 according to an embodiment of the present invention.

Figure 3:
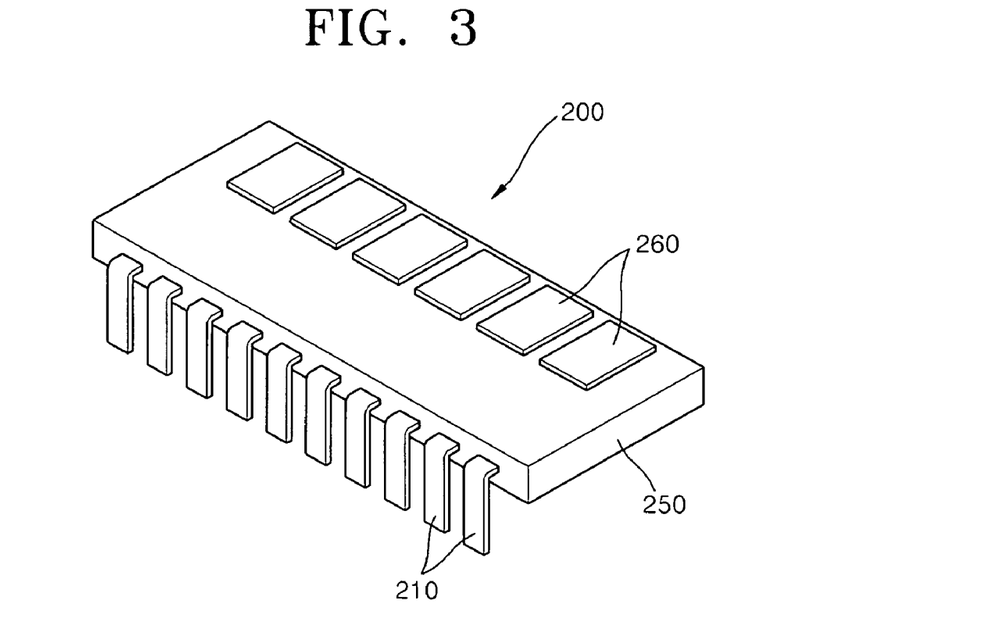
FIG. 3 is a perspective view of a control package in the power module of FIG. 1.

Referring to FIGS. 1 through 3, the power package 100 and the control package 200 are stacked in a vertical direction. The power package 100 and the control package 200 can be provided as molded packages that can be independently separated from each other, or that can be joined with each other by a conductive bonding member 310. The conductive bonding member 310 may comprise a material such as solder or a conductive epoxy material. The power package 100 and the control package 200 can be electrically coupled to each other through the bonding member 310, and thus, can form a power system when they are combined together.

Since the power package 100 and the control package 200 can be provided separately, the power module 300 according to the current embodiment of the present invention can be easily applied in various power products according to needs of customers. For example, the power module 300 can be applied in motor drives, power-inverters, power-converters, power factor corrections (PFCs), or display drives. However, the examples of applying the power module 300 are provided for describing the present invention, and the present invention is not limited to the above examples.

The power package 100 can include one or more power devices 120 and 125 mounted on a first lead frame 140. For example, each of the power devices 120 and 125 can be a power metal-oxide semiconductor field effect transistor (MOSFET), a bipolar transistor, a diode, or an insulating gate bipolar transistor (IGBT). That is, the first power device 120 can be an IGBT and the second power device 125 can be a diode, for example. However, the present invention is not limited to the above example.

The first lead frame 140 can include a first surface 142 and a second surface 144. The first surface 142 and the second surface 144 can be defined as opposite surfaces of the first lead frame 140 when the first lead frame 140 is disposed as a plane. The power devices 120 and 125 can be mounted on the first surface 142.

One or more conductive bumps 130 can be disposed between the first lead frame 140 and the power devices 120 and 125. The conductive bumps 130 can electrically couple the first lead frame 140 and the power devices 120 and 125 to each other. For example, the conductive bumps 130 can include solder balls or solder paste. The power devices 120 and 125 have conductive pads (not shown) that are coupled to internal circuits, and the conductive bumps 130 can be coupled to the conductive pads. The power package 100 having the above-described structure can be referred to as a flip-chip package.

A heat dissipation substrate 105 can be disposed on the power devices 120 and 125, such that the heat dissipation substrate 105 is disposed on sides of the power devices 120 and 125 opposite to the sides that are adjacent to the first lead frame 140. The heat dissipation substrate 105 is attached to rear surfaces of the power devices 120 and 125 to rapidly dissipate the heat generated from the power devices 120 and 125. The heat dissipation substrate 105 can be attached to the rear surfaces of the power devices 120 and 125 using an adhesive member 110, for example, a solder having a high thermal conductivity. An end portion of the first lead frame 140 can be bent in a direction opposite to that in which the heat dissipation substrate 105 is disposed with respect to the first lead frame 140, that is, in a direction from the first surface 142 to the second surface 144. Accordingly, when the power module 300 is inserted into a product, the heat dissipation substrate 105 can be exposed outside of the product and the heat can be dissipated efficiently.

The heat dissipation substrate 105 can be a substrate having a high thermal conductivity, for example, a printed circuit board (PCB), a flexible PCB (FPCB), an insulated metal substrate (IMS), a direct bonded copper (DBC), or a ceramic substrate. However, the present invention is not limited to the above examples.

A first molding member 150 (e.g., an epoxy molding material) can be disposed to protect the power devices 120 and 125. For example, the first molding member 150 can be disposed on the first surface 142 of the first lead frame 140 so as to cover the power devices 120 and 125 and to expose a surface of the heat dissipation substrate 105. An exterior surface of the molding member 150 can be substantially coplanar with the exterior surface of the heat dissipation substrate. The surface of the heat dissipation substrate 105 is exposed to the outside so that the heat generated from the power devices 120 and 125 can be dissipated rapidly without passing through the first molding member 150.

In other embodiments, it may be possible mold the first molding member 150 so that it has exterior surfaces which are substantially coplanar with the back surfaces of the power devices 120 and 125. This can be useful if the back surfaces of the power devices form electrical terminals such as drain terminals for power MOSFETs that are formed in the power devices 120, 125. In this case, a conductive clip or the like may provide electrical connections from those electrical terminals to an underlying circuit board.

Furthermore, the first molding member 150 can be further provided on the second surface 144 such that a first part 144a of the second surface 144 of the first lead frame 140 is exposed. The exposed first part 144a of the second surface 144 can function as an electrode of the power package 100 for being coupled to the control package 200. The first molding member 150 can include an insulating resin, for example, epoxy molding compound (EMC).

The control package 200 can include at least one control device 225 attached to a second lead frame 210. The control device 225 can control the power devices 120 and 125. The second lead frame 210 can include a third surface 212 and a fourth surface 214, and the control device 225 can be attached onto the third surface 212 using an adhesive member 220. The third surface 212 and the fourth surface 214 can be defined as opposite surfaces of the second lead frame 210 when the second lead frame 210 is assumed to be planar. The type and the number of control devices 225 can be appropriately selected according to the type of the power module 300.

The power consumption of the control device 225 can be much lower than that of the power devices 120 and 125. Accordingly, a thickness of the second lead frame 210 can be less than that of the first lead frame 140. Therefore, the expense of the second lead frame 210 can be reduced. An end portion of the second lead frame 210 can be bent in a direction from the fourth surface 214 to the third surface 212, that is, in the same direction as the first lead frame 140.

One or more conductive wires 230 can electrically couple the control device 225 to the lead frame 210. The control package 200 having this structure can be referred to as a wire bonding package. However, the structure of the control package 200 can be variously modified, and the present invention is not limited to the above example. For example, the control package 200 can have a flip-chip package structure that is similar to the power package 100.

A second molding member 250 can be provided to protect the control device 225. The second molding member 250 can be disposed on the third surface 212 of the second lead frame 210 so as to cover the control device 225. The second molding member 250 can be further provided on the fourth surface 214 such that a first part 214a of the fourth surface 214 of the second lead frame 210 can be exposed from the second molding member 250. The exposed first part 214a of the fourth surface 214 can perform as an electrode of the control package 200 for being coupled to the power package 100. The second molding member 250 can include an insulating resin, for example, EMC (epoxy molding compound). The second molding member 250 may comprise the same or different material than the first molding member 150.

The power package 100 and the control package 200 can be electrically coupled to each other by bonding the first part 144a of the second surface 144 of the first lead frame 140 with the first part 214a of the fourth surface 214 of the second lead frame 210. For example, at least one first wiring member 160 can be formed on the first part 144a of the second surface 144 of the first lead frame 140, and at least one second wiring member 260 can be formed on the first part 214a of the fourth surface 214 of the second lead frame 210. The first wiring member 160 and the second wiring member 260 can bond to each other using solder to thus form the bonding member 310.

As another example, the first wiring member 160 and the second wiring member 260 can be bonded to each other using a conductive adhesive or a conductive tape to form the bonding member 310. Otherwise, the first wiring member 160 and the second wiring member 260 can be omitted, and the first lead frame 140 and the second lead frame 210 can be directly bonded to each other using a solder, or using the conductive adhesive or the conductive tape.

In the power module 300, the power package 100 and the control package 200 can be stacked vertically. Therefore, an area occupied by the power module 300 is nearly similar to that occupied by the power package 100. The addition of the control package 200 to the power package 100 does not cause the thickness of the control package 200 to increase in any appreciable way. Thus, the power module 300 of the current embodiment is very suitable for high integration, and thus, can be used in small and lightweight power products. In addition, since the power package 100 and the control package 200 can be separated and provided in small sizes, the reliability of the power package 100 and the control package 200 can be improved, and accordingly, the reliability of the power module 300 can be improved.

As shown in FIGS. 1-3, power package 100 and the control package are cooperatively configured with each other, so that the resulting power module appears as if it is a unitary structure. For example, the second molding member 150 fills a space defined by the first molding member 150. Hereinafter, a method of fabricating the power module 300 will be described with reference to FIGS. 4 through 10.

FIGS. 4 through 7 are cross-sectional views illustrating a method of fabricating the power package 100 of the power module 300, according to an embodiment of the present invention.

Figure 4:
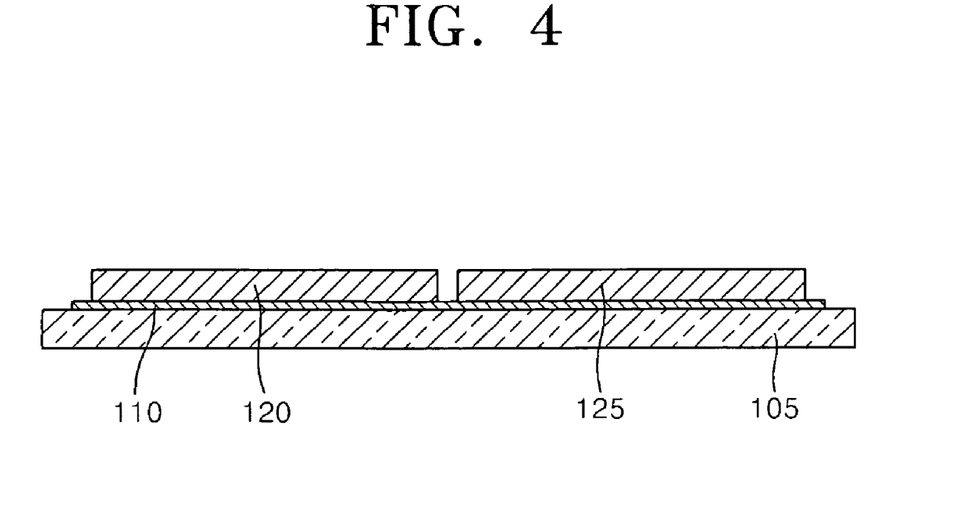
FIGS. 4 through 7 are cross-sectional views illustrating a method of fabricating a power package of a power module, according to an embodiment of the present invention.

Referring to FIG. 4, the power devices 120 and 125 can be mounted on the heat dissipation substrate 105. That is, the adhesive member 110 can be formed on the heat dissipation substrate 105, and then, the power devices 120 and 125 can be mounted on the adhesive member 110. For example, the adhesive member 110 can be formed on the heat dissipation substrate 105 by depositing solder having high thermal conductivity using a screen-printing method.

Figure 5:
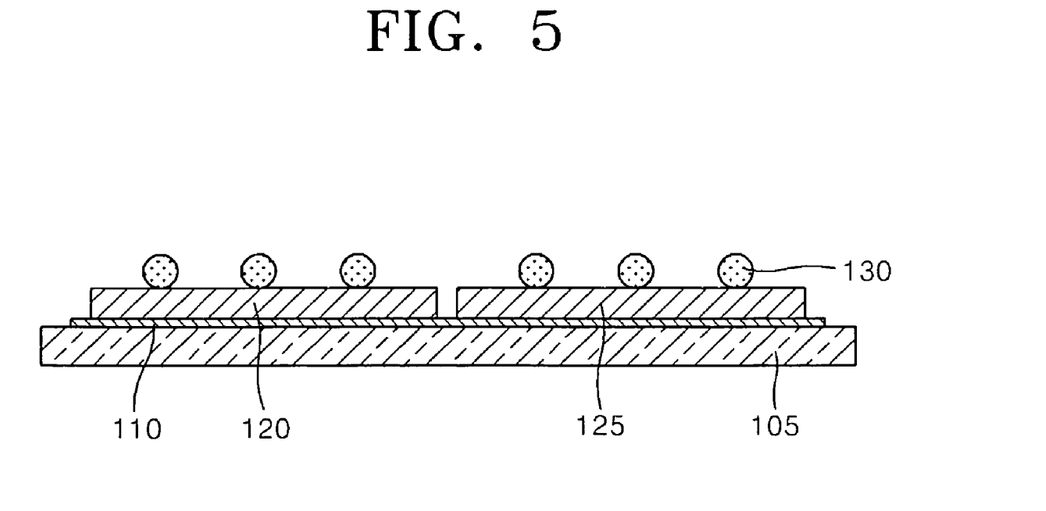

Referring to FIG. 5, the conductive bumps 130 are formed on the power devices 120 and 125. For example, the conductive bumps 130 can be formed by forming the solder balls or applying solder paste onto the power devices 120 and 125.

Figure 6:
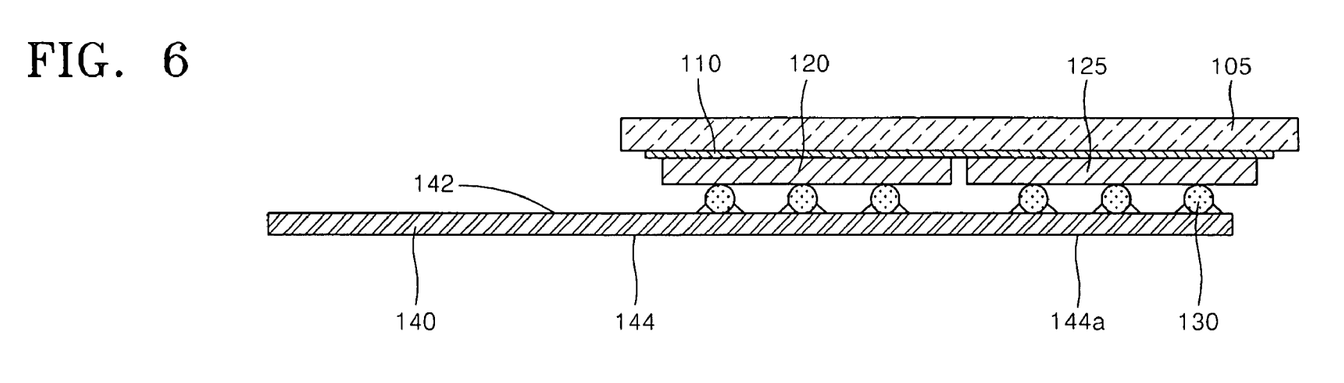

Referring to FIG. 6, the first lead frame 140 is disposed on the conductive bumps 130 such that the first surface 142 of the first lead frame 140 can contact the conductive bumps 130. Next, the adhesive member 110 and the conductive bumps 130 can be simultaneously reflowed. The simultaneous reflow operation can reduce the number of processes. However, the adhesive member 110 and the conductive bumps 130 can be separately reflowed or some parts of the adhesive member 110 and the conductive bumps 130 can be reflowed. Flux (not shown) generated during the reflow operation can be selectively removed.

In other embodiments of the invention, the power devices 120 and 125 may first be attached to the first lead frame 140, and then the heat dissipation substrate 105 may be attached to the power devices 120 and 125.

Figure 7:
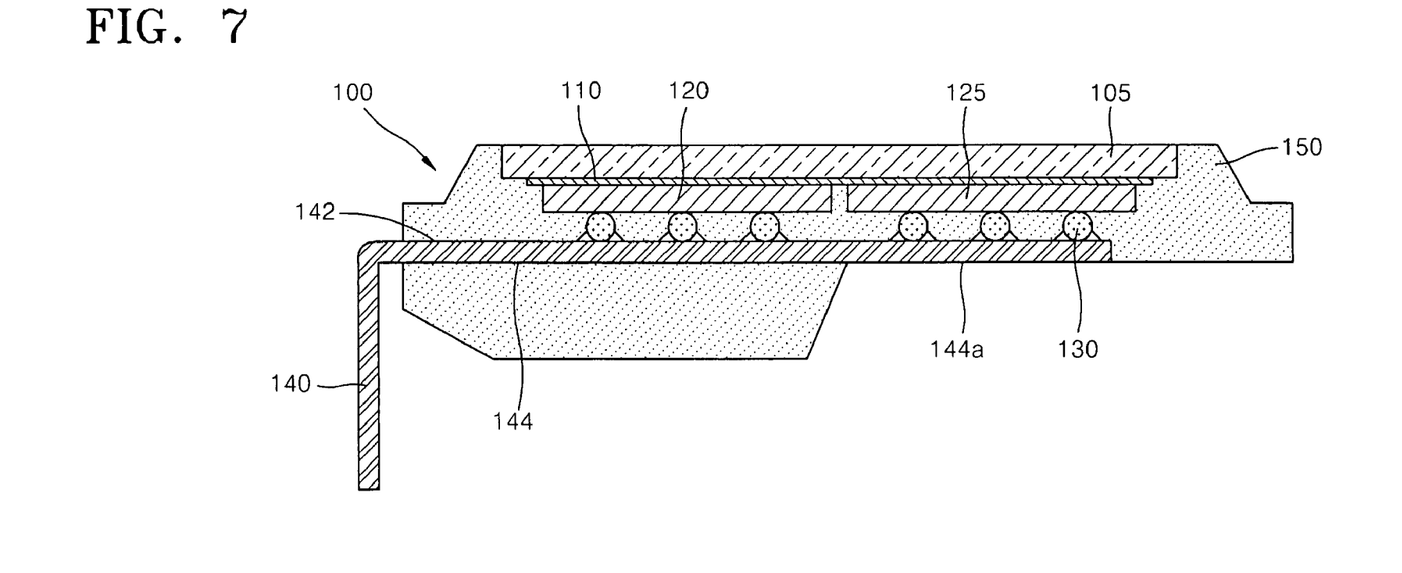

Referring to FIG. 7, the first molding member 150 can be formed to protect the power devices 120 and 125. The first molding member 150 may be formed on both surfaces of the first lead frame 140 so as to lock the first lead frame 140. It may also be formed so as to expose a surface of the heat dissipation substrate 105 and the first part 144a of the second surface 144 of the first lead frame 140. For example, the first molding member 150 can be formed by fixing the stacked structure including the first lead frame 140 and the power devices 120 and 125 in a predetermined mold (not shown), injecting an insulating resin, and then, solidifying the insulating resin.

The exposed surface of the heat dissipation substrate 105 can directly dissipate the heat transmitted from the power devices 120 and 125 without passing through the first molding member 150. The first part 144a of the second surface 144 of the first lead frame 140 can perform as terminals coupling the power package 100 to the control package 200, which will be described later.

Optionally, the end portion of the first lead frame 140 can be trimmed, and then, bent in a direction opposite to that in which the heat dissipation substrate 105 is disposed with respect to the first lead frame 140; that is, in a direction from the first surface 142 to the second surface 144. Accordingly, the end portion of the first lead frame 140 is bent away from the heat dissipation substrate 105 to be inserted into a power device.

Figure 8:
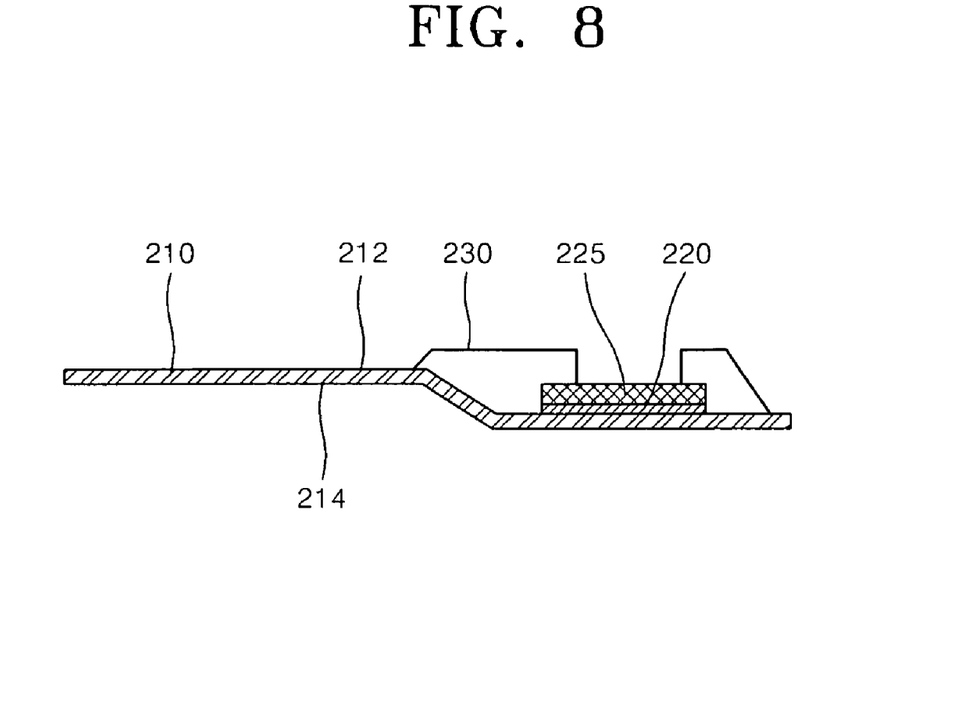
FIGS. 8 and 9 are cross-sectional views illustrating a method of fabricating a control package of a power module, according to an embodiment of the present invention.
Figure 9:
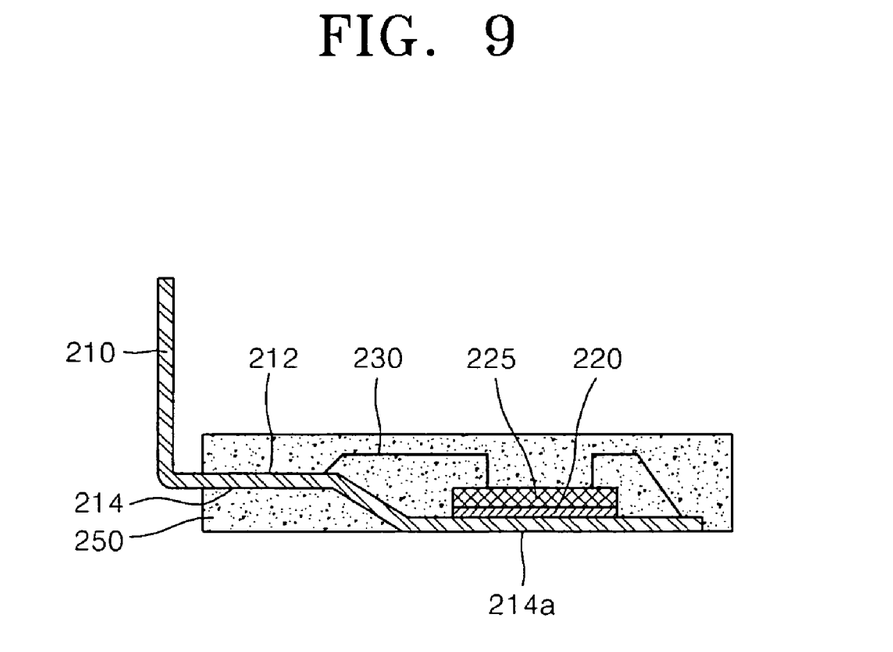

FIGS. 8 and 9 are cross-sectional views illustrating a method of fabricating the control package 200 of the power module 300, according to an embodiment of the present invention.

Referring to FIG. 8, the control device 225 can be mounted on the second lead frame 210. For example, the second lead frame 210 includes the third surface 212 and the fourth surface 214, and the control device 225 can be attached to the third surface 212 using the adhesive member 220. According to an embodiment of the present invention, the second lead frame 210 is formed to have a depressed portion such that the control device 225 is mounted in the depressed portion. However, the present invention is not limited thereto. For example, the second lead frame 210 can be modified to have planar shape without including the depressed portion or to have a protrusion.

In addition, the control device 225 and the second lead frame 210 can be electrically coupled to each other using the wires 230. The wires 230 can be coupled to the control device 225 and the second lead frame 210 using a bonding method. However, in another embodiment of the present invention, the control device 225 and the second lead frame 210 can be coupled to each other using the conductive bumps 130 described with reference to FIGS. 5 and 6, instead of using the wires 230. That is, the control device 225 and the second lead frame 210 can be electrically coupled to each other using wire bonding or conductive bumps.

Referring to FIG. 9, the second molding member 250 can be formed to protect the control device 225. The second molding member 250 is formed on the third and fourth surfaces 212 and 214 of the second lead frame 210 so as to lock the second lead frame 210. It may also be formed to expose a first part 214a of the fourth surface 214 of the second lead frame 210. The second molding member 250 can be formed by fixing the stacked structure of the second lead frame 210 and the control device 225 in a predetermined mold (not shown), injecting an insulating resin into the mold, and then, solidifying the insulating resin.

Next, the end portion of the second lead frame 210 is trimmed, and then, can be bent toward the control device 225, that is, in a direction from the fourth surface 214 to the third surface 212.

Figure 10:
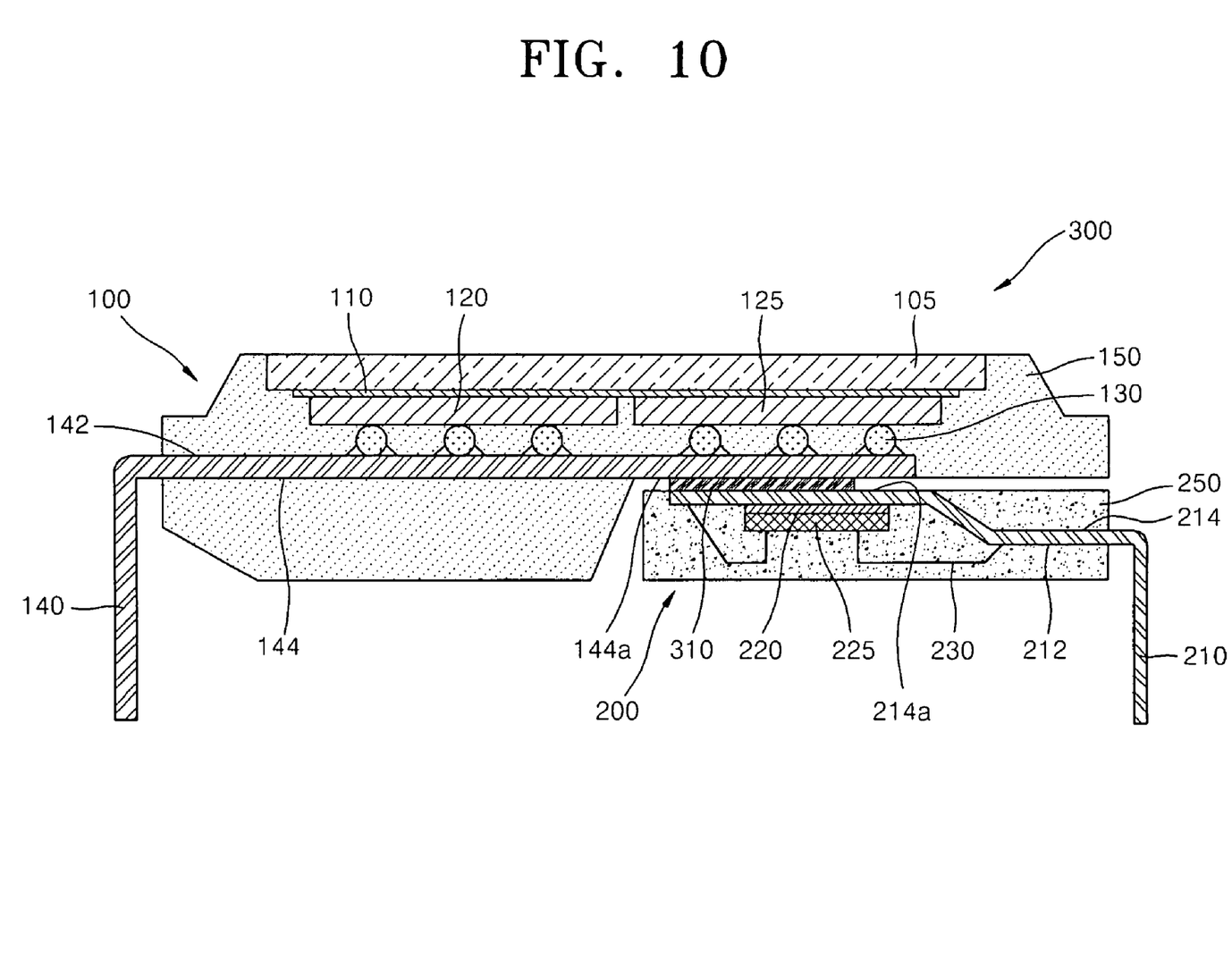
FIG. 10 is a cross-sectional view for describing a method of combining the power package and the control package, according to an embodiment of the present invention.

FIG. 10 is a cross-sectional view for describing a method of combining the power package 100 and the control package 200, according to an embodiment of the present invention.

Referring to FIG. 10, the power package 100 and the control package 200 are stacked perpendicularly to form the power module 300. In this stacking process, the power package 100 and the control package 200 can be electrically coupled to each other by bonding the first lead frame 140 with the second lead frame 210.

The bonding process can be performed using an appropriate method such as soldering. For example, the bonding member 310 is injected between the first part 144a of the second surface 144 of the first lead frame 140 and the first part 214a of the fourth surface 214 of the second lead frame 210. Then, the bonding member 310 is reflowed to bond the first lead frame 140 with the second lead frame 210. The bonding member 310 can include solder, such as the first wiring pad 160 of FIG. 2 and the second wiring pad 260 of FIG. 3.

As shown, ends of the first lead frame 140 and the second lead frame 210 are extend laterally away from the end surfaces of the first molding member 150 and the second molding member 250. In other embodiments of the invention, the ends could be co-extensive with the lateral surfaces of the first and second molding members 150 and 250, as in a microlead type package (MLP).

Plating layers (not shown) can be optionally formed on surfaces of the first lead frame 140 and the second lead frame 210 for performing finishing processes. The plating layers can include lead, tin, or an alloy thereof.

In another embodiment of the present invention, the trimming and bending processes of the first lead frame 140 in FIG. 7 and the trimming and bending processes of the second lead frame 210 in FIG. 9 can be omitted, and the trimming and bending processes of the first and second lead frames 140 and 210 can be simultaneously performed after performing the above bonding process. In this case, the end portions of the first lead frame 140 and the second lead frame 210 can be bent in the same direction, that is, in a direction opposite to that in which the heat dissipation substrate 105 is disposed with respect to the first lead frame 140.

The method of fabricating the power package 100 illustrated in FIGS. 4 through 7 and the method of fabricating the control package 200 shown in FIGS. 8 and 9 can be performed independently from each other. That is, the power package 100 and the control package 200 can be separately provided. Therefore, various combinations of the power package 100 and the control package 200 can be provided according to the needs of customers and the types of power products including the power module 300. In addition, since the power package 100, which is expensive, can be formed to have a small size, the fabrication costs of the power module 300 can be reduced.

Moreover, since the power consumption of the control device 225 is lower than those of the power devices 120 and 125, the thickness of the second lead frame 210 can be formed to be thinner than that of the first lead frame 140. Accordingly, the fabrication costs of the second lead frame 210 can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

For example, although two distinct packages are used to form a single module in the specific embodiments of the invention that are described herein, embodiments of the invention are not limited thereto. For example, three, four, five, or more distinct packages may be combined into a single module in other embodiments of the invention.

What is claimed is:

1. A power module comprising:
   a molded power package comprising at least one power device on a first lead frame; and
   a molded control package vertically stacked on the power package, and comprising at least one control device on a second lead frame,
   wherein a first part of the first lead frame and a first part of the second lead frame are coupled to each other so that the power package and the control package are electrically coupled to each other,
   wherein the power package further comprises one or more first wiring pads on the first part of the first lead frame, and the control package further comprises one or more second wiring pads on the first part of the second lead frame,
   wherein the power module further comprising solder, and wherein the one or more first wiring pads and the one or more second wiring pads are bonded to each other with the solder.

2. The power module of claim 1, wherein the power package further comprises a first molding member covering the power device such that the first part of the first lead frame is exposed out of the first molding member.

3. The power module of claim 2, wherein the first lead frame comprises a first surface and a second surface, the power device is disposed on the first surface, and a part of the second surface is exposed out of the first molding member to bond to the first part of the second lead frame.

4. The power module of claim 3, wherein an end portion of the first lead frame is bent in a direction from the first surface to the second surface.

5. The power module of claim 2, wherein the power package further comprises a heat dissipation substrate that is disposed on a surface of the power device opposite to that disposed on the first lead frame such that a part of the heat dissipation substrate is exposed out of the first molding member.

6. The power module of claim 1, wherein the control package further comprises a second molding member covering the control device such that the first part of the second lead frame is exposed out of the second, molding member.

7. The power module of claim 6, wherein the second lead frame comprises a third surface and a fourth surface, the control device is disposed on the third surface, and a part of the fourth surface is exposed out of the second molding member to bond to the first part of the first lead frame.

8. The power module of claim 7, wherein an end portion of the second lead frame is bent in a direction from the fourth surface to the third surface.

9. The power module of claim 1, wherein the power package further comprises one or more conductive bumps between the power device and the first lead frame.

10. A power module comprising:
    a first lead frame having a first surface and a second surface;
    at least one power device disposed on the first surface of the first lead frame;
    a first molding member covering the at least one power device, and exposing a first part of the second surface of the first lead frame;
    a second lead frame having a third surface and a fourth surface, wherein a first part of the fourth surface is bonded with the exposed first part of the second surface of the first lead frame;
    at least one control device disposed on the third surface of the second lead frame; and
    a second molding member covering the at least one control device, and exposing the first part of the fourth surface of the second lead frame.

11. The power module of claim 10, wherein the exposed first part of the second surface of the first lead frame and the exposed first part of the fourth surface of the second lead frame are bonded to each other using soldering.

12. The power module of claim 10, further comprising:
    a heat dissipation substrate disposed on a surface of the at least one power device on opposite to that disposed on the first lead frame, wherein a part of the heat dissipation substrate is exposed out of the first molding member.

13. The power module of claim 12, wherein an end portion of the first lead frame and an end portion of the second lead frame are bent in a direction opposite to that in which the heat dissipation substrate is disposed with respect to the first lead frame.

14. The power module of claim 10, wherein the power package comprises a flip-chip package structure.

15. A method of fabricating a power module, the method comprising:
    forming a molded power package comprising at least one power device on a first lead frame;
    forming a molded control package comprising at least one control device on a second lead frame; and
    bonding a first part of the first lead frame with a first part of the second lead frame so that the power package and the control package can be electrically coupled to each other,
    wherein the bonding of the first part of the first lead frame with the first page of the second lead frame is performed using a soldering process.

16. The method of claim 15, wherein the soldering process comprises:
    injecting solder between the first part of the first lead frame and the first part of the second lead frame; and
    reflowing the solder.

17. The method of claim 15, wherein the forming of the power package comprises:
    forming one or more conductive bumps on the power device;
    disposing the first lead frame on the conductive bumps;
    reflowing the one or more conductive bumps; and
    forming a first molding member covering the power device, whereby the first part of the first lead frame is exposed.

18. The method of claim 17, wherein the forming of the power package further comprises:
    stacking the power device on a heat dissipation substrate before forming the one or more conductive bumps.

19. The method of claim 15, wherein the forming of the control package comprises:
    mounting the at least one control device on the second lead frame;
    electrically coupling the second lead frame to the control device; and
    forming a second molding member covering the control device, whereby the first part of the second lead frame is exposed.

20. The method of claim 19, wherein the electrical coupling between the second lead frame and the control device is performed using a wire bonding or a bump connection.

21. The method of claim 15, further comprising:
    trimming and bending end portions of the first lead frame and the second lead frame after performing the bonding process.

* * * * *

UNITED STATES PATENT AND TRADEMARK OFFICE
CERTIFICATE OF CORRECTION

PATENT NO. : 7,687,903 B2  Page 1 of 1
APPLICATION NO. : 12/220638
DATED : March 30, 2010
INVENTOR(S) : Son et al.

It is certified that error appears in the above-identified patent and that said Letters Patent is hereby corrected as shown below:

Claim 6, Col. 9, Ln. 44: delete the "," after "second, molding member" so that it reads --second molding member--.

Signed and Sealed this

Eleventh Day of May, 2010

David J. Kappos
*Director of the United States Patent and Trademark Office*